United States Patent [19]

Fujii et al.

[11] Patent Number: 4,572,286

[45] Date of Patent: Feb. 25, 1986

[54] BOILING COOLING APPARATUS

[75] Inventors: Masao Fujii; Kazushige Nakao; Haruo Tetsuno, all of Hyogo, Japan

[73] Assignee: Mitsubishi Denki Kabushiki Kaisha, Tokyo, Japan

[21] Appl. No.: 366,124

[22] Filed: Apr. 7, 1982

[30] Foreign Application Priority Data

Apr. 7, 1981 [JP]  Japan ................................ 56-53466
Dec. 22, 1981 [JP] Japan ............................... 56-208648
Dec. 22, 1981 [JP] Japan ............................... 56-208849

[51] Int. Cl.⁴ ...................... F28D 15/00; H01F 27/10
[52] U.S. Cl. ......................... 165/104.29; 165/104.19; 165/104.21; 165/104.33; 361/385
[58] Field of Search ................... 165/104.21, 104.19, 165/104.29, 104.33; 122/33; 361/385

[56] References Cited

U.S. PATENT DOCUMENTS 2,886,746  5/1959  Saby ................................. 165/104.29
3,435,283  3/1969  Beurtheret et al. ......... 165/104.21 X
3,579,162  5/1971  Savbar ............................ 165/104.33
3,626,080  12/1971 Pierce ......................... 165/104.21 X Primary Examiner—Albert W. Davis, Jr.
Attorney, Agent, or Firm—Sughrue, Mion, Zinn, Macpeak & Seas

[57] ABSTRACT

The boiling cooling apparatus is comprised of a heat generating device which is completely immersed in a liquid coolant which partially fills a sealed container. At least one vertically extending passage is provided through the heat producing device whereby ascending bubbles formed in the passage by the heat transfer from the heat generating device to the liquid medium cause an upward current flow through the passage. A plurality of current flow control plates are provided for diverting the upward flow of liquid coolant laterally and downwardly along the sides of the container to provide convection cooling of the liquid and directing the downward flow of liquid coolant into the lower end of the passage in the heat generating device to provide a cyclic flow of the cooling liquid.

3 Claims, 17 Drawing Figures

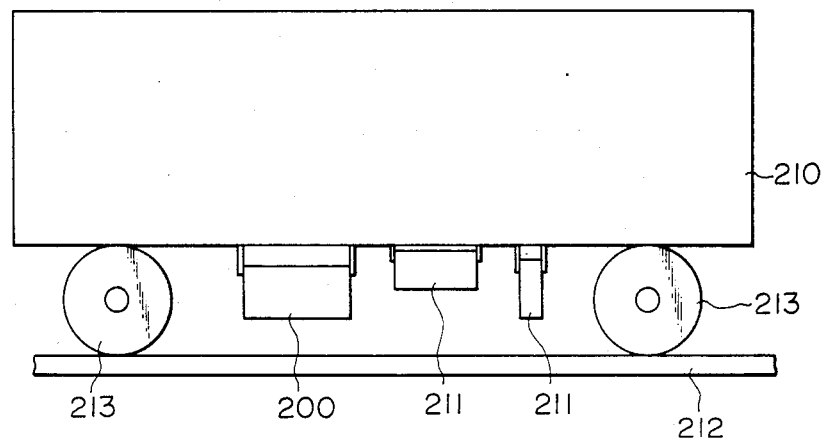

BOILING COOLING APPARATUS

BACKGROUND OF THE INVENTION

When using electronic equipment on rail vehicles it was generally necessary to shelter the various components of the electronic equipment from environmental pollution by dust or projected water. However, by sheltering or enclosing the electronic components completely within a housing, the cooling of the electronic components became more difficult.

A prior art arrangement for cooling electronic power equipment such as power semiconductors was developed wherein the power semiconductors were directly immersed in FREON in a sealed container without pumps or cooling fans. This prior art arrangement is disclosed in a paper entitled "Two Phase FREON Cooling for Electronic Power Equipment" presented at proceedings of the International Conference on Advanced Propulsion Systems for Urban Rail Vehicles, February 1980, which was sponsored by the U.S. Department of Transportation, Urban Mass Transportation Administration and coordinated by the MITRE Corporation of McLean, Virginia. Although the semiconductors are completely immersed in the liquid FREON the container is not completely filled with liquid FREON and is partially filled with FREON vapor. Thus, the heat produced by the semiconductors causes the liquid FREON surrounding the semiconductors to vaporize and rise to the surface of the liquid FREON in the form of bubbles. The heat is then transferred from the cylinder to the atmosphere by means of a plurality of fins protruding outwardly from the container. As the FREON vapor is cooled the FREON will condense on the inner wall of the container and flow back into the liquid FREON. The returning coolant is agitated by the turbulant action of the ascending bubbles so that part of the heat produced by the semiconductor is transferred by convection of the liquid coolant to the area of the inner wall of the container which is in contact with the liquid coolant and is dissipated to the exterior of the container through the container wall. However, in such a prior art arrangement, the agitation of the liquid coolant by the turbulant action of the ascending bubbles is erratic and the coefficient of heat transfer by convection is so small that only a small part of the heat is dissipated by convection heat transfer.

SUMMARY OF THE INVENTION

The present invention provides a new and improved boiling cooling apparatus which controls the turbulent action of the ascending bubbles and the flow of the liquid coolant to increase the efficiency of the cooling apparatus.

The present invention provides a new and improved boiling cooling apparatus comprising a sealed container, a liquid cooling medium partially filling said container, heat producing means completely immersed in said liquid medium and having at least one vertically extending passage means in communication with said medium and current flow control plate means immersed in said medium for controlling the flow of liquid medium caused by ascending bubbles. First current flow control plates are provided in spaced relation to the walls of the container to define passages between the first current control plate and the housing for the downward flow of coolant with the lower ends of the passages communicating with the vertically extending passage means in said heat producing means. The inner walls of the container may be provided with projections for causing turbulance and the size of the passages may be varied for increasing the heat transfer efficiency from the liquid medium to the walls of the container. Second current flow control plates are provided above the heat generating means for laterally directing the flow of bubbles rising from the heat generating means to improve the flow of the liquid medium within the container.

The foregoing and other objects, features and advantages of the invention will be apparent from the following more particular description of preferred embodiments of the invention as illustrated in the accompanying drawings.

BRIEF DESCRIPTION OF THE DRAWINGS

FIG. 10 is a schematic view showing the location of a boiling cooling apparatus according to the present invention when used in conjunction with a vehicle.

DETAILED DESCRIPTION OF THE INVENTION

Figure 1:
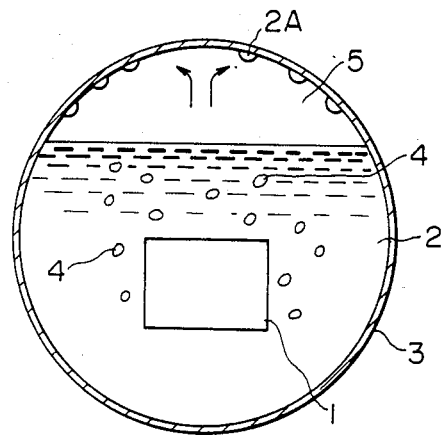
FIG. 1 is a schematic cross-sectional view of a prior art boiling cooling apparatus.

The present invention relates to an improvement of the cooling efficiency of a boiling cooling apparatus which utilizes ebullition heat transfer to cool a heat generating element such as a semiconductor device for power generation. In the prior art embodiment of FIG. 1 a heat generating assembly, which may include a plurality of heat generating elements, is totally immersed in a liquid coolant such as FREON or the like within a cylindrical container 3. A plurality of bubbles 4 are produced within the liquid coolant as a result of heat transfer from the heat generating assembly 1. The space 5 above the upper surface of the liquid coolant is filled with a vapor of the coolant and the droplets 2A are formed by the liquid coolant condensing on the inner wall of the container 3. As a result, the heat produced by the heat generating assembly 1 is dissipated to the exterior of the container 3 in the form of the latent heat of condensation. The condensed coolant drops return to the liquid coolant which is being agitated by the turbulant action of the ascending bubbles. A portion of the heat produced by the heat generating assembly 1 is transferred by the convection of the liquid coolant 2 to the area of the inner wall of the container 3 which is in contact with the coolant and is dissipated to the exterior of the container through the container wall.

Since the agitation of the liquid coolant by the turbulant action of the ascending bubbles tends to be very erratic and since the coefficient of heat transfer by convection is so small, the present invention has provided a number of current control plates within the liquid coolant in order to increase the efficiency of the apparatus.

Figure 2:
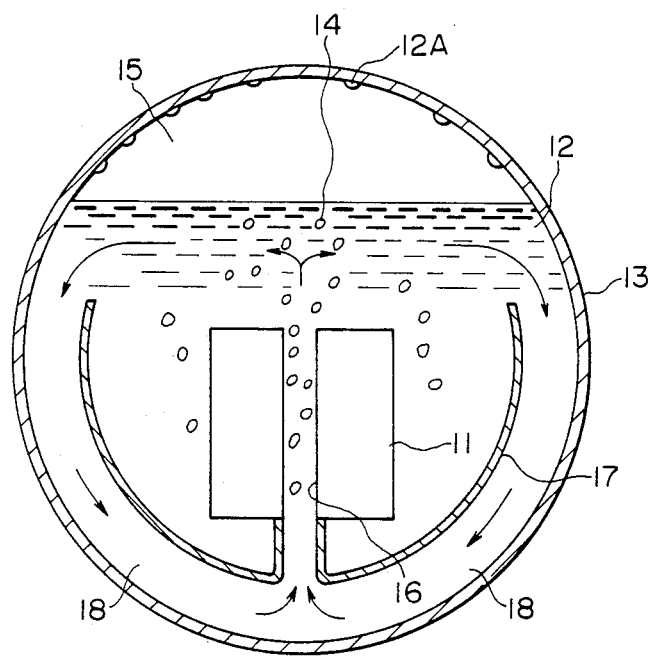
FIG. 2 is a schematic cross-sectional view of boiling cooling controlling apparatus according to a first embodiment of the present invention.
Figure 4:
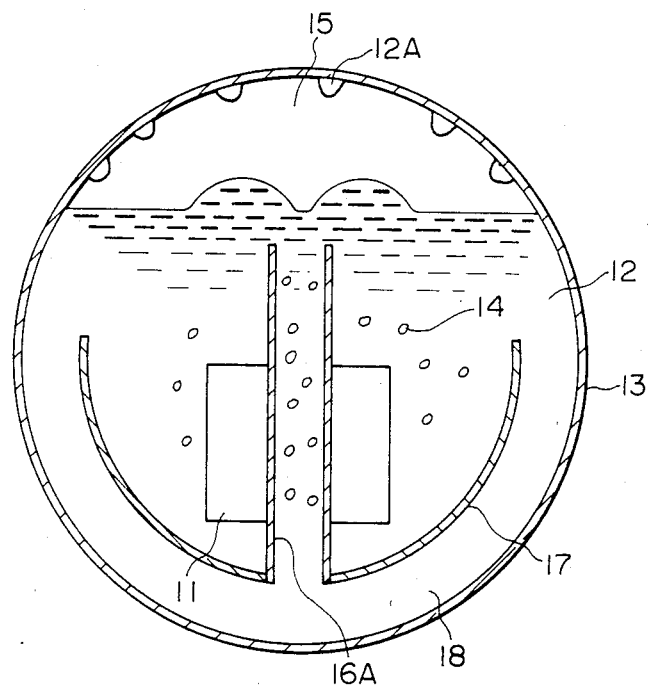
FIG. 4 is a schematic cross-sectional view of a boiling cooling apparatus according to a third embodiment of the present invention.

In the first embodiment of the present invention as shown in FIG. 2, the heat generating assembly 11 is provided with a passage 16 which extends vertically through the interior thereof. The passage 16 may extend below the heat generating element as shown in FIG. 2 or may be provided with upper and lower extensions as shown in the embodiment of FIG. 4. A pair of current controlling plates 17 having a cylindrical cross-section are disposed in spaced parallel relation to the cylindrical walls of the housing 13 with the lower ends thereof connected to the bottom of the passage 16. Thus, as the bubbles 14, which are generated by the heat dissitated from the heat generating assembly 11, rise to the surface of the liquid coolant, the frictional force developed between the bubbles 14 and the liquid coolant 12 due to viscosity provide a "bubble pumping action" so that it forms an upward flow of the liquid coolant 12 within the passage 16. If the heat produced by the heat generating assembly 11 is too small to generate bubbles 14 in the passage 16 the coolant 12 in the passage 16 is heated and its density is decreased to develop buoyancy. In either case, the heat produced from the heat generating assembly 11 causes an ascending flow of liquid within the passage 16. The force of the ascending coolant is increased as the difference between the average density of the gas (bubbles 14) and the liquid in the passage 16 and that of the liquid coolant 12 exterior of the passage 16, that is, as the height of the passage 16 in the vertical direction is increased.

Therefore, the liquid coolant circulates in the direction shown by the arrows in FIG. 2 and increases the efficiency of convection heat transfer between the liquid coolant in the passages 18 and the inner wall of the cylindrical container 13. A part of heat is also transferred to the cylindrical housing 13 by means of the vapor in the space 15 which condenses on the container in the form of droplets 12A.

Figure 3:
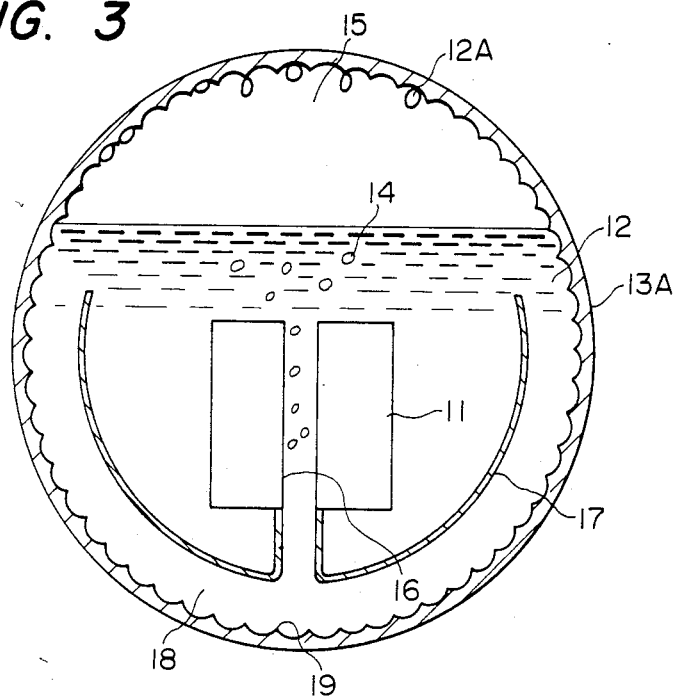
FIG. 3 is a schematic cross-sectional view of a boiling cooling apparatus according to a second embodiment of the present invention.

In the second embodiment shown in FIG. 3, the arrangement of the heat generating assembly and the current controlling plates 17 is substantially identical to that of the previous embodiment but the interior surface of the cylindrical housing 13A is formed with a plurality of projections 19 which serve to promote the formation of a turbulent flow. Needless to say the projections 19 are also capable of increasing the area of the heat transfer surface. The formulation of a turbulent flow can also be further promoted by providing similar projections on the surfaces of the current controlling plates 17 which face the inner wall of the cylindrical container 13A.

The third embodiment shown in FIG. 4 is similar to the embodiment shown in FIG. 2 but the length of the passage 16A has been extended above the heat generating assembly 11 into relatively close proximity to the surface of a liquid coolant 12. As stated previously, the force of the circulating liquid coolant 12 is increased as the vertical height of the passage 16 is increased so that the upwardly flowing liquid coolant 12 within the passage 16 rises above the stationary level of the coolant and impinges against the inner wall of the container 13 to achieve enhanced cooling.

Figure 5:
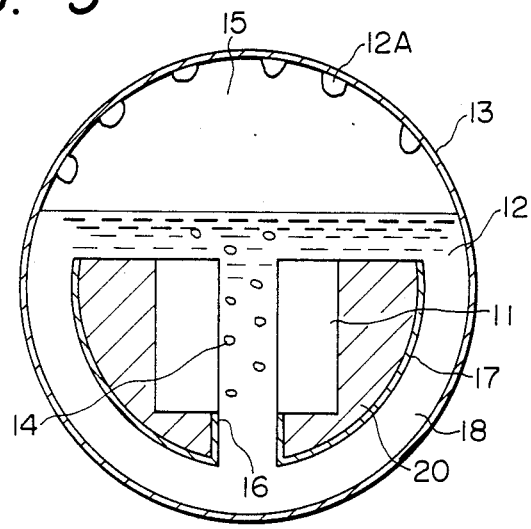
FIG. 5 is a schematic cross-sectional view of a boiling cooling apparatus according to a fourth embodiment of the present invention.

In the fourth embodiment of the invention as shown in FIG. 5 the space between the current controlling plates 17 and the heat generating assembly 11 has been filled with a suitable filler 20 to decrease the amount of liquid coolant 12 needed to be charged into the container 13. Since most of the heat produced by heat generating assembly 11 is dissipated from the surface of the assembly 11 defining a portion of the passage 16 the use of the filler material does not affect the efficiency of the boiling cooling apparatus.

In each of the foregoing embodiments the container 13 is made of a cylindrical tube but any other form can be used, for example a tube having a rectangular cross-section. Since the boiling cooling apparatus of the present invention provides at least one passage through the interior of the heat generating assembly through which the liquid coolant flows as a result of ascending bubbles produced by the heat from the heat generating assembly, the efficiency of the heat transfer between the container and the liquid coolant is improved so that a reduction in the size of the cooling apparatus may be made.

Figure 6:
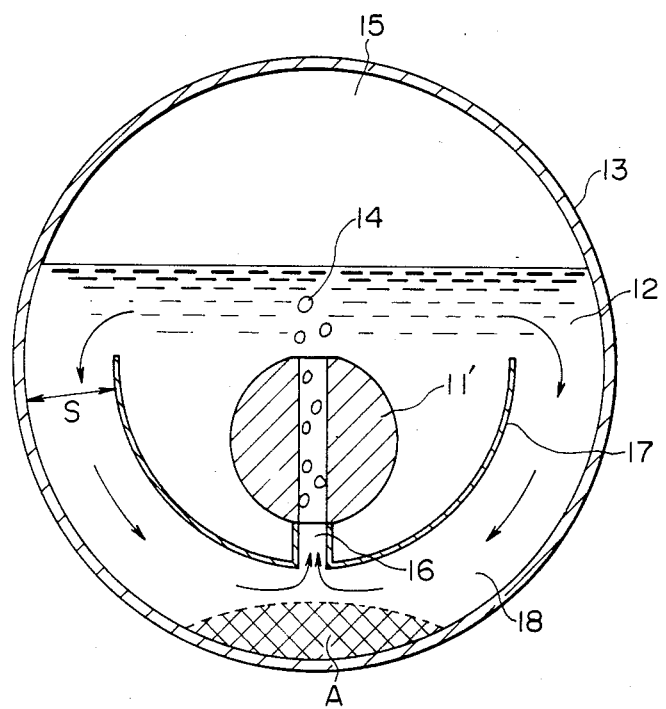
FIG. 6 is an explanatory view relating to an apparatus similar to that disclosed in FIG. 2.

FIG. 6 shows an ebullition cooling apparatus similar to that disclosed in FIG. 1 for the purpose of illustrating a problem which arises with respect to the transfer of heat by convection as the liquid coolant traverses the passages 18 in contact with the wall of the container 13. As illustrated in FIG. 6 the width S of the passages 18 between the current control plates 17 and the inner wall of the container 13 is substantially uniform so that the liquid coolant 12 becomes stagnant at the bottom of the container in the cross-hatched area A. Therefore heat dissipation in this area is inhibited. It is estimated that this area counts for at least 20 percent of the total area of heat dissipation surface and therefore the problem increases as the size of the container 13 increases. Also the area of stagnant liquid coolant increases when the distance H between the bottom of the heat generating assembly 11" and the inner wall of the container 13 increases as shown in FIG. 4.

Figure 7:
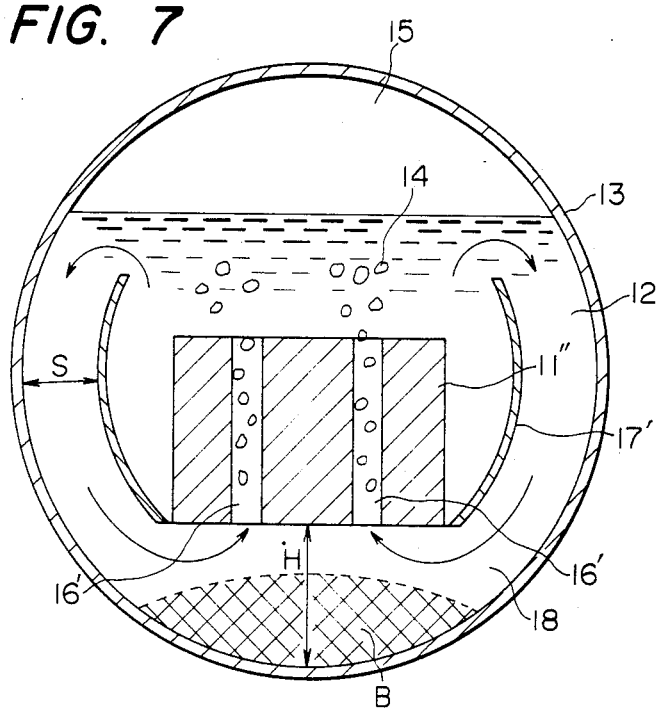
FIG. 7 is an explanatory view relating to a modified form of construction similar to that shown in FIG. 2.
Figure 8:
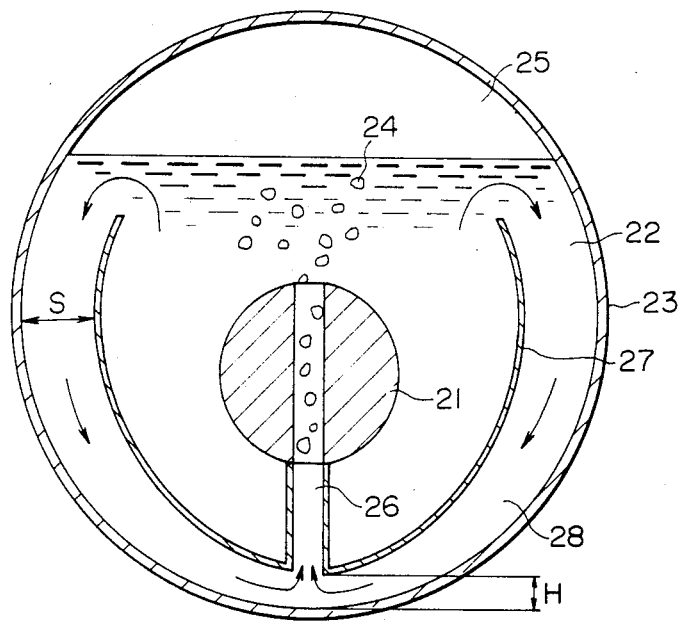
FIG. 8 is a schematic cross-sectional view of a boiling cooling apparatus according to a fifth embodiment of the present invention.

In order to eliminate the stagnant areas A and B as shown in FIGS. 6 and 7 the distance H of the current control plates 17 from the bottom of the container 23 must be reduced. In the fifth embodiment of the present invention as shown in FIG. 8 the distance of the plates 27 from the inner walls of the container 23 decrease from the upper end of the passages 28 to the lower ends thereof where the passages communicate with the vertically extending passage 26. With this arrangement the flow velocity of the liquid coolant 12 flowing through the passageways 28 is faster in the lower portion of the container 23 than in the upper part and in a like manner the heat transfer coefficient C is higher in the lower part of the container than in the upper part thereof. At the same time the possibility of the liquid coolant 12 becoming stagnant at the bottom of the container 23 is minimized. In the embodiment of FIG. 8 the plates 27' are integral with means for defining the lower ends of the passages 26 which extend upwardly through the heat generating assembly 21'. As in the embodiment of FIG. 8 the distance S between the current controlling plates 27' and the inner wall of the container 23 is reduced gradually from the top of the passages 28 to the bottom thereof and the distance H is substantially reduced.

Figure 9:
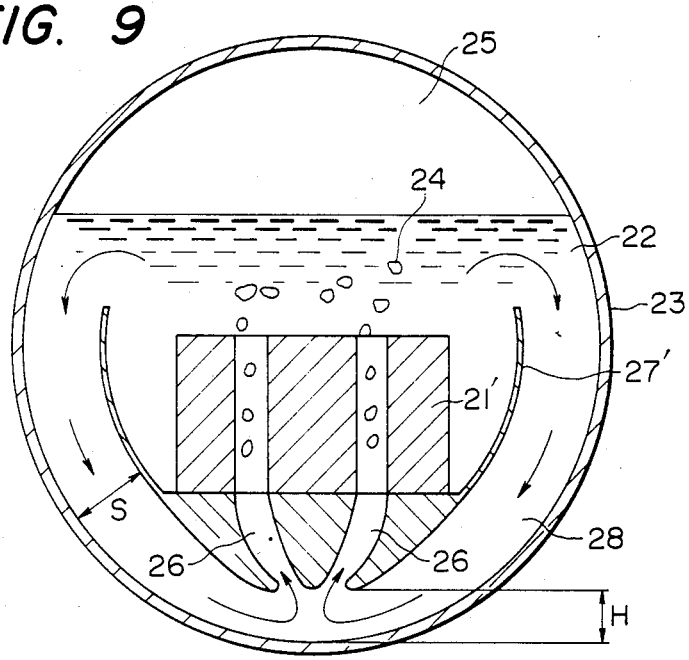
FIG. 9 is a schematic cross-sectional view of a boiling cooling apparatus according to a sixth embodiment of the present invention.

The removal of the stagnant areas at the bottom of the container and the increase in the efficiency of the heat transfer by convection offers a particular advantage when the boiling cooling apparatus is installed under the floor of a vehicle such as an electric railway car 210 as shown in FIG. 10. The various other electrical devices 211 used in conjunction with an electric railway car are also secured under the floor of the electric railway car 210 and the wind blowing beneath the floor when the car is running is strongest at the bottom of the boiling cooling apparatus 200 then becomes weaker towards the top thereof since it is hindered by the other electrical devices 211. Therefore an increase in the temperature of the heat generating element within the boiling cooling apparatus 200 can be inhibited or effectively minimized when the heat transfer coefficient at the bottom is maximized by the arrangement shown in FIGS. 8 and 9. The wheels 213 of the railway car are adapted to ride on a rail 212 in the conventional manner.

Figure 11:
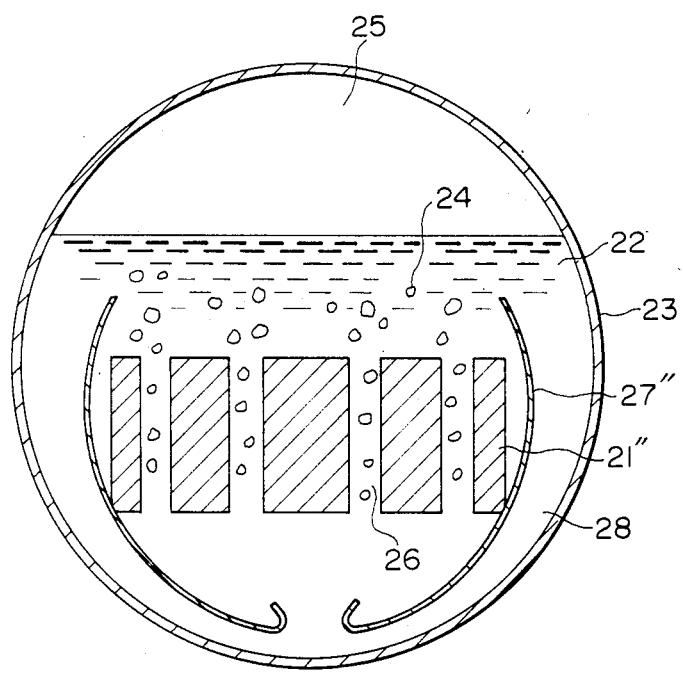
FIG. 11 is a schematic cross-sectional view of a boiling cooling apparatus according to a seventh embodiment of the present invention.

In the seventh embodiment of the present invention as shown in FIG. 11 the heat generating apparatus 21" is substantially wider than in the previous embodiments and is therefore provided with a plurality of vertically extending cooling passages 26. Since the lower ends of the current flow control plates 27" must be spaced fairly close together and since the vertically extending passages 26 are spread a further distance apart it suffices to provide the lower ends of the current control plates 27" which are closest to the bottom of the container 23 with a smooth reverse bend which will assist in providing a smooth flow liquid coolant 12 from the passages 28 toward the passages 26 with a reduced pressure loss.

Figure 12:
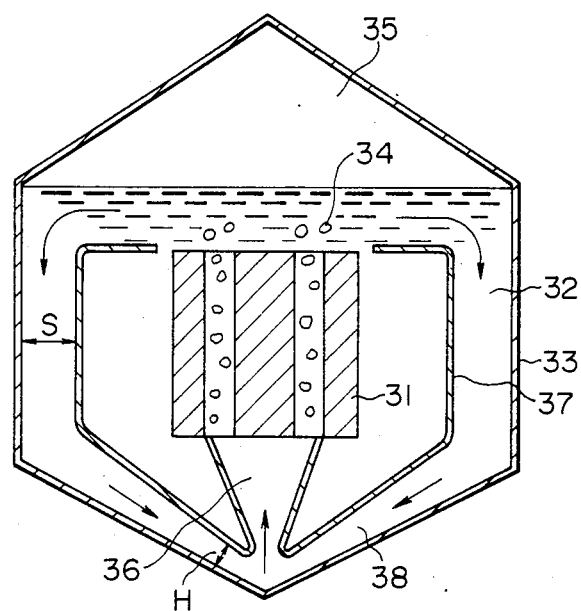
FIG. 12 is a schematic cross-sectional view of a boiling cooling apparatus according to an eigth embodiment of the present invention.
Figure 13:
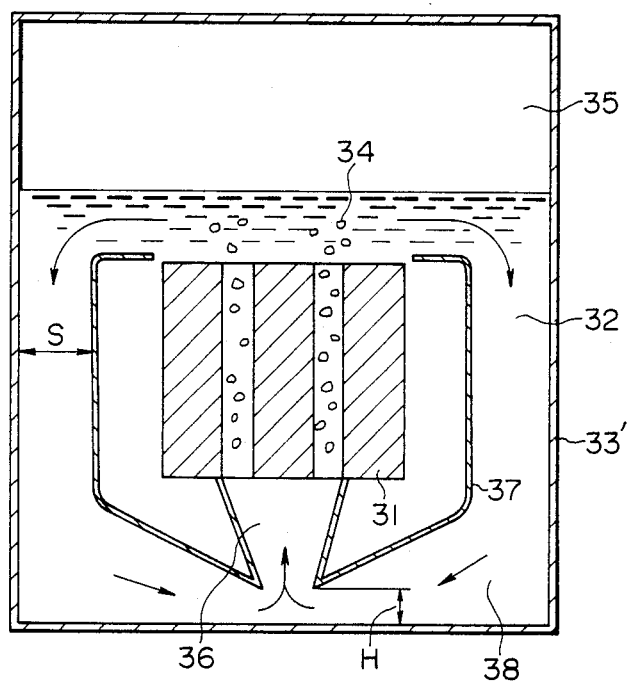
FIG. 13 is a schematic cross-sectional view of a boiling cooling apparatus according to a ninth embodiment of the present invention.

In the eighth embodiment according to the present invention as shown in FIG. 12 the container 33 is formed as a tube having a hexagonal cross-section while in the nineth embodiment of the present invention as shown in FIG. 13 the container 33' has a rectangular cross-section. In both of these embodiments the heat generating assembly 31 is provided with passageways 36 through the heat generating assembly 31 and the current control plates 37 are arranged relative to the housing so as to provide a relatively wide spacing S at the top of the passages 38 and a relatively narrow spacing H at the lower end of the passageways 38 so as to provide an increased liquid coolant flow in the lower part of the container to reduce the chances of the coolant becoming stagnant in the bottom of the container and thereby enchancing the heat dissipation occurring at the bottom of the container. The current control plates 37 are reversely bent at the lower end of the housing so as to channel the flow of fluid into the vertically extending passages through the heat generating assembly 31. Thus the formation of an involute current occurring other than in the intended circulating path is reduced thereby achieving further heat dissipation.

Figure 14:
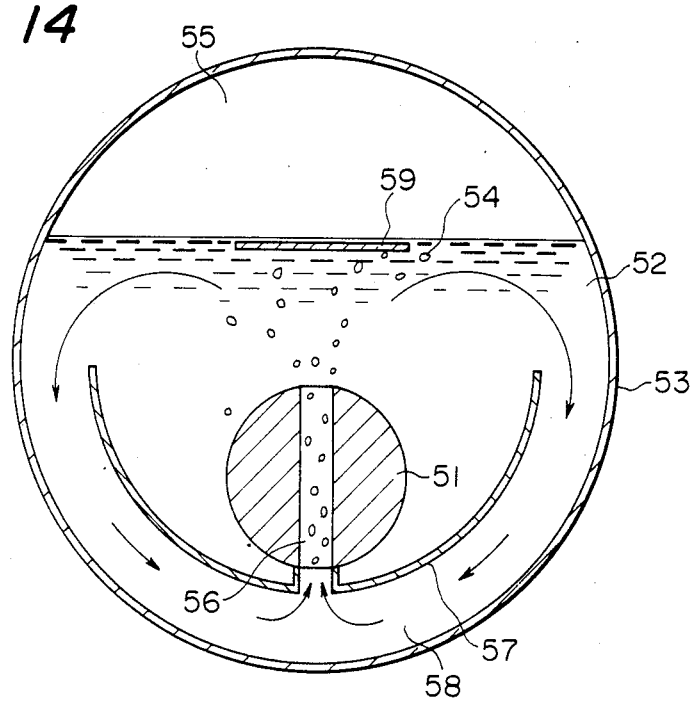
FIG. 14 is a schematic cross-sectional view of a boiling cooling apparatus according to a tenth embodiment of the present invention.
Figure 15:
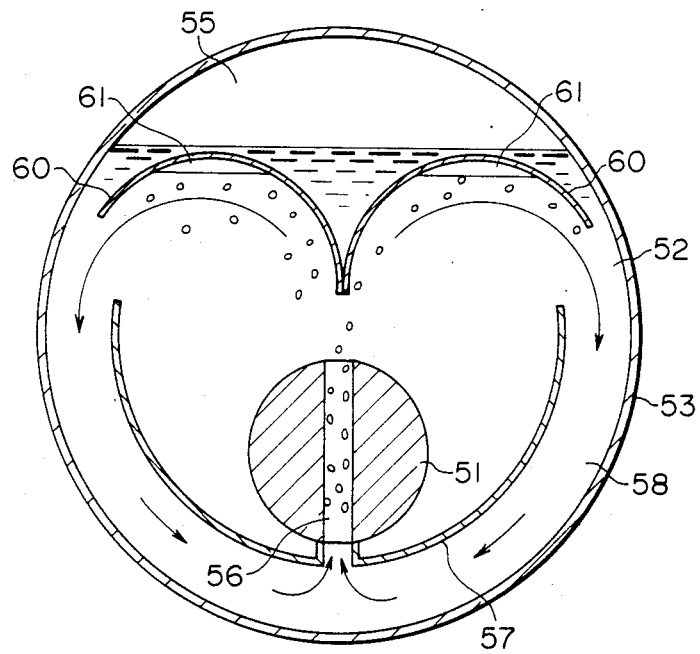
FIG. 15 is a schematic cross-sectional view of a boiling cooling apparatus according to an eleventh embodiment of the present invention.

In the four embodiments of the present invention shown in FIGS. 14–17 the flow of the liquid coolant 52 caused by the ascending bubbles 54 is enhanced by the location of one or more wave attenuating plates immediately below the surface of the liquid coolant and above the vertical passage 56 extending through the heat generating assembly 51. In the absence of such a wave attenuating plate the rising bubbles 54 cause the surface of the coolant 52 to ripple or form small waves. This rippling inhibits the efficient conversion of the driving force of the ascending flow to the decending flow along the inner wall of the container 53 through the passages 58 defined by the current forming plates 57. In the embodiment of FIG. 14 a simple, flat horizontally disposed plate 59 is provided thereby deflecting the rising bubbles 54 laterally to generate the current in the direction shown by the arrows. In the embodiment of FIG. 15 a pair of upwardly and outwardly curved guide plates 60 are provided which define a bubble trapping area 61 adjacent the uppermost portion of each curved plate. The guide plates 60 gradually change the direction of the ascending flow and minimize the loss of circulating force due to rippling.

Figure 16:
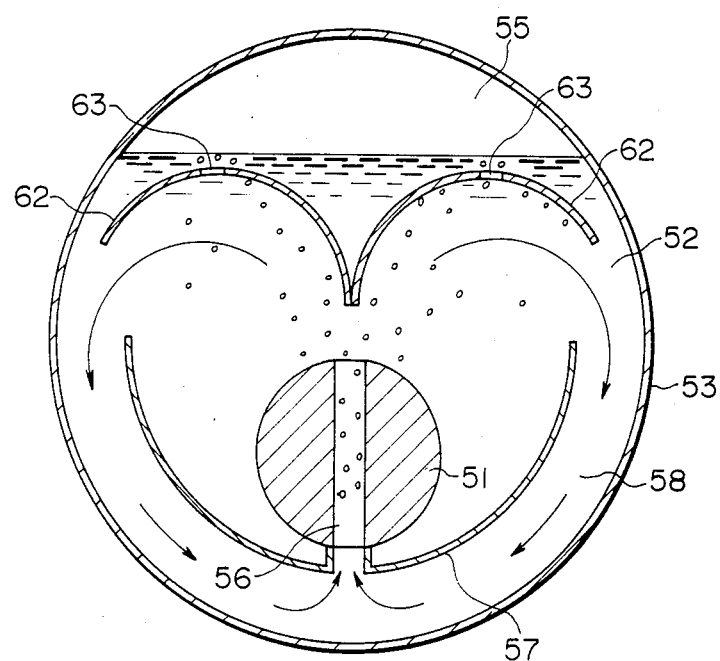
FIG. 16 is a schematic cross-sectional view of a boiling cooling apparatus according to a twelfth embodiment of the present invention.

In the embodiment of FIG. 16 the configuration of the guide plates 62 is substantially identical to the configuration of the guide plates 60 in the embodiment of FIG. 15. However, apertures 63 have been provided at the highest point of the curved plate 62 so as to allow the bubbles which collect at that point to be dissipated gradually into the vapor filled space 55 above the liquid coolant 52 with a minimum amount of surface rippling. In the absence of such apertures the trapped bubbles in this area may cause this area of the guide plates 62 to become overheated.

Figure 17:
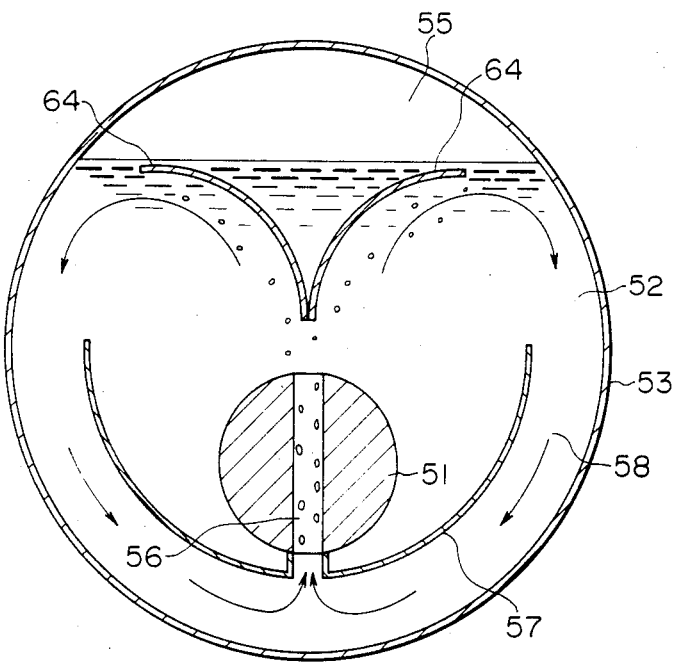
FIG. 17 is a schematic cross-sectional view of a boiling cooling apparatus according to a thirteenth embodiment of the present invention.

In the embodiment of FIG. 17 the curved guide plates 64 terminate just below the surface of the liquid coolant 52 thereby preventing the collection of bubbles and allowing the bubbles to escape into the vapor filled space 55 with a minimum amount of surface rippling. Also since the flow of bubbles and liquid coolant defined by the curved plates 62 is directed onto the surface of the container just below the surface of the liquid coolant there is less apt to be a stagnant area of liquid coolant such as might be formed behind the upper ends of the curved plates 60 and 62 in FIGS. 15 and 16. Therefore the heat transfer efficiency is enhanced by the arrangement shown in FIG. 17.

While the invention has been paticularly shown and described with reference to a preferred embodiment thereof it will be understood that those skilled in the art that the foregoing and other changes in form and details may be made therein without departing from the spirit and scope of the invention.

What is claimed is:

1. A boiling cooling apparatus having a liquid coolant, a heat generating element immersed in the liquid coolant, a container for accommodating said liquid coolant and heat generating element, a first passageway provided in said heat generating element so that the bubbles of said liquid coolant formed by the heat produced from said heat generating element flow upwardly through said first passageway, a guide positioned in the upper part of the liquid coolant in said container so as to prevent the rippling of the liquid coolant caused by the ascending flow of intermingled liquid coolant and bubbles that pass through the first passageway and baffle means surrounding the sides of said element in spaced relation to the inner wall of the container to define a second passageway whereby said liquid coolant is induced to flow downwardly in contact with the inner wall of said container by the force developed by the ascending flow of said bubbles and wherein said baffle means is connected to the bottom of said first passageway so that the descending flow of said liquid coolant is directed to the first passageway.

2. A boiling cooling apparatus according to claim 1 wherein the guide is curved upward.

3. A boiling cooling apparatus according to claim 2 wherein the upwardly curved guide has a hole in the top.

* * * * *